United States Patent [19]
Tomiya et al.

[11] Patent Number: 5,766,345
[45] Date of Patent: Jun. 16, 1998

[54] EPITAXIAL GROWTH METHOD OF SEMICONDUCTOR

[75] Inventors: Shigetaka Tomiya; Kazushi Nakano, both of Tokyo; Satoshi Ito; Rikako Minatoya, both of Kanagawa, all of Japan

[73] Assignee: Sony Corporation, Tokyo, Japan

[21] Appl. No.: 543,283

[22] Filed: Oct. 16, 1995

[30] Foreign Application Priority Data

Oct. 17, 1994 [JP] Japan ................... 6-250801

[51] Int. Cl.$^6$ ................... C30B 25/14
[52] U.S. Cl. ................... 117/105; 117/92; 117/108; 117/956; 117/958
[58] Field of Search ................... 117/956, 958, 117/108, 92, 105

[56] References Cited

U.S. PATENT DOCUMENTS

| | | | |
|---|---|---|---|
| 4,095,004 | 6/1978 | Fraas et al. | 117/956 |
| 5,057,183 | 10/1991 | Tomomura et al. | 117/958 |
| 5,068,204 | 11/1991 | Kukimoto et al. | 437/127 |
| 5,140,385 | 8/1992 | Kukimoto et al. | 357/17 |
| 5,492,080 | 2/1996 | Ohkawa et al. | 117/956 |

FOREIGN PATENT DOCUMENTS

A-0 380 106  8/1990  European Pat. Off.
A-0 656 431  6/1995  European Pat. Off.

OTHER PUBLICATIONS

Patent Abstracts of Japan, vol. 013, No. 169 (C–587), Apr. 21, 1989 & JP–A–63 31926 (Hitachi Ltd), Dec. 27, 1988.

A. Taike, et al.,"P–Type Conductivity Control of ZnSe Highly Doped with Nitrogen by Metalorganic Molecular Beam Epitaxy", *Applied Physics Letters*, vol. 56, No. 20, May 14, 1990, pp. 1989–1991, XP 000149929.

Patent Abstracts of Japan, vol. 012, No. 306 (C–522), Aug. 19, 1988 & JP–A–63 079795 (Nippon Sheet Glass Co. Ltd), Apr. 9, 1988.

*Primary Examiner*—Robert Kunemund
*Attorney, Agent, or Firm*—Hill & Simpson

[57] ABSTRACT

An epitaxial growth method of semiconductor can reliably avoid irregularities from being produced when a II-VI compound semiconductor is grown epitaxially. When this method is applied to a method of manufacturing a semiconductor light-emitting device, it is possible to obtain a semiconductor light-emitting device having a long life and excellent light-emitting characteristic. When a II-VI compound semiconductor is grown epitaxially, a VI/II ratio, i.e., a supplying ratio of VI-group element and II-group element used in the epitaxial growth is selected in a range of from 1.3 to 2.5.

8 Claims, 2 Drawing Sheets

EPITAXIAL GROWTH METHOD OF SEMICONDUCTOR

BACKGROUND OF THE INVENTION

The present invention relates to an epitaxial growth method of semiconductor for use in manufacturing a semiconductor laser made of II-VI compound semiconductor and light-emitting devices such as a light-emitting diode, for example.

II-VI compound semiconductors are epitaxially grown by molecular beam epitaxy (MBE) or metal organic chemical vapor deposition (MOCVD). When a II-VI compound semiconductor light-emitting device made of II-VI compound semiconductor, e.g., semiconductor laser is manufactured, a ZnCdSe/ZnSSe heterointerface or ZnMgSSe/SnSe heterointerface is formed on a GaAs substrate. The ZnCdSe layer or ZnSe layer has a lattice mismatching for the GaAs substrate and a stress is generated in these heterointerfaces. This stress increases when the interface is not flat. The increased stress reduces a critical thickness of a film wherein a satisfactory epitaxy can be carried out. Also, the increased stress causes a crystal defect to occur easily. Furthermore, the above stress is one of factors for increasing defects when the semiconductor laser is conducted.

Since the light-emitting device made of II-VI compound semiconductor, e.g., semiconductor laser can emit laser beam of short wavelength, it receives a remarkable attention as a high-density optical recording and reproducing light source and a demand for extending its lifetime becomes increasingly high.

SUMMARY OF THE INVENTION

In view of the aforesaid aspect, it is an object of the present invention to provide an epitaxial growth method of semiconductor in which the occurrence of irregularities can reliably be avoided when a II-VI compound semiconductor is epitaxially grown.

It is another object of the present invention to provide an epitaxial growth method of semiconductor which can obtain a semiconductor light-emitting device which is excellent in life and light-emitting characteristic when applied to a manufacturing method of a semiconductor light-emitting device.

Specifically, when a II-VI compound semiconductor is epitaxially grown, if a compound semiconductor and a heterojunction are epitaxially grown by controlling a supplying ratio of VI-group element and II-group element for fabricating II-VI compound semiconductor, i.e., VI/II ratio, then there can be obtained an excellent flatness. Therefore, the present invention is to provide an epitaxial growth method of semiconductor based on such researches.

According to an aspect of the present invention, when a II-VI compound semiconductor is epitaxially grown, a VI/II ratio in the epitaxial growth, i.e., a supplying ratio of VI-group element and II-group element is selected in a range of from 1.3 to 2.5.

In accordance with an aspect of the present invention, a II-VI compound semiconductor layer with an excellent flatness wherein a root mean square surface roughness is 10 nm or lower could be stably reliably obtained.

Further, although a temperature of the epitaxially-grown substrate in the epitaxial growth is selected to be a relatively high temperature, i.e., in a range of from 250° C. to 300° C., a II-VI compound semiconductor with an excellent flatness could be stably reliably epitaxially grown.

Furthermore, when a ZnMgSSe semiconductor light-emitting device is manufactured, a semiconductor light-emitting device, e.g., semiconductor laser which can emit light with a short wavelength over a long period of time could be constructed. The reason for this was that, when an excellent flatness was obtained on each heterointerface, a stress within the crystal could be reduced.

DETAILED DESCRIPTION OF THE PREFERRED EMBODIMENT

Prior to describing the embodiment of the present invention, a fundamental principle of the present invention will be described briefly below.

Having analyzed a crystal structure of this kind of semiconductor light-emitting device, the assignee of the present application found that a heterointerface within a film epitaxially grown by ordinary MBE is not always flat and has periodic irregularities and clarified that the resultant irregularities are one of factors for shortening a life of the semiconductor light-emitting device. Then, the assignee of the present application has clarified that such irregularities are produced remarkably when an epitaxial growth temperature, i.e., a heating temperature of an epitaxially-grown substrate is selected to be 250° C. or higher in order to effect an epitaxial grown with excellent crystallinity.

A method of the present invention will now be described with reference to the drawings.

According to the present invention, when a II-VI compound semiconductor is epitaxially grown, a VI/II ratio, i.e., a supply ratio of VI-group element and II-group element is selected in a range of from 1.3 to 2.5.

In a ZeSe II-VI compound semiconductor light-emitting device, e.g., semiconductor laser, a ZnSe layer formed on a GaAs substrate as a buffer layer, a ZnMgSSe layer formed across active layers as a cladding layer and a ZnSSe ($ZnS_{0.07}Se_{0.93}$) layer formed as a guide layer were crystallized and grown by MBE with the VI/II ratio being changed and a flatness on the topmost surface was evaluated by a transmission electron microscope (TEM).

When the VI/II ratio was 1.2, irregularities of height of 100 nm were produced at a period of 44 nm on the crystal surface in a [110] axis direction. Thus, it was confirmed that a flatness is deteriorated. When the VI/II ratio was in a range of from 1.3 to 2.5, the crystal surface demonstrated an excellent flatness.

Table 1 shows measured results of a relationship between the VI/II ratio and a root-mean-square surface roughness (rms roughness (nm)). The following table 1 indicates respective measured numerical values concretely. While a substrate temperature was 280° C., almost similar measured results were obtained at a substrate temperature ranging from 250° C. to 300° C.

TABLE 1

| VI/II ratio | rms roughness (nm) |
|---|---|
| 0.68000 | 5.7000 |
| 0.95000 | 4.5000 |
| 1.3000 | 1.5000 |
| 1.9000 | 1.3000 |
| 2.6000 | 2.3000 |
| 3.0000 | 3.0000 |

From study of table 1, it was confirmed that the flat layers could be epitaxially grown according to the method of the present invention wherein the VI/II ratio was selected in a range of from 1.3 to 2.5.

Figure 1:
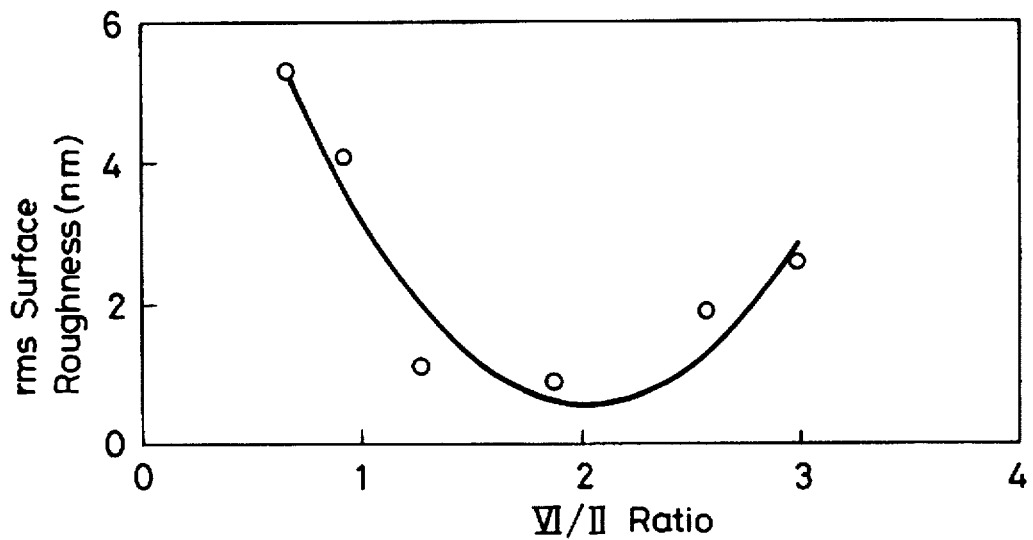
FIG. 1 is a graph showing measured results of a relationship between a VI-II ratio and a root-mean-square surface roughness obtained when a II-VI compound semiconductor is epitaxially grown.
Figure 2:
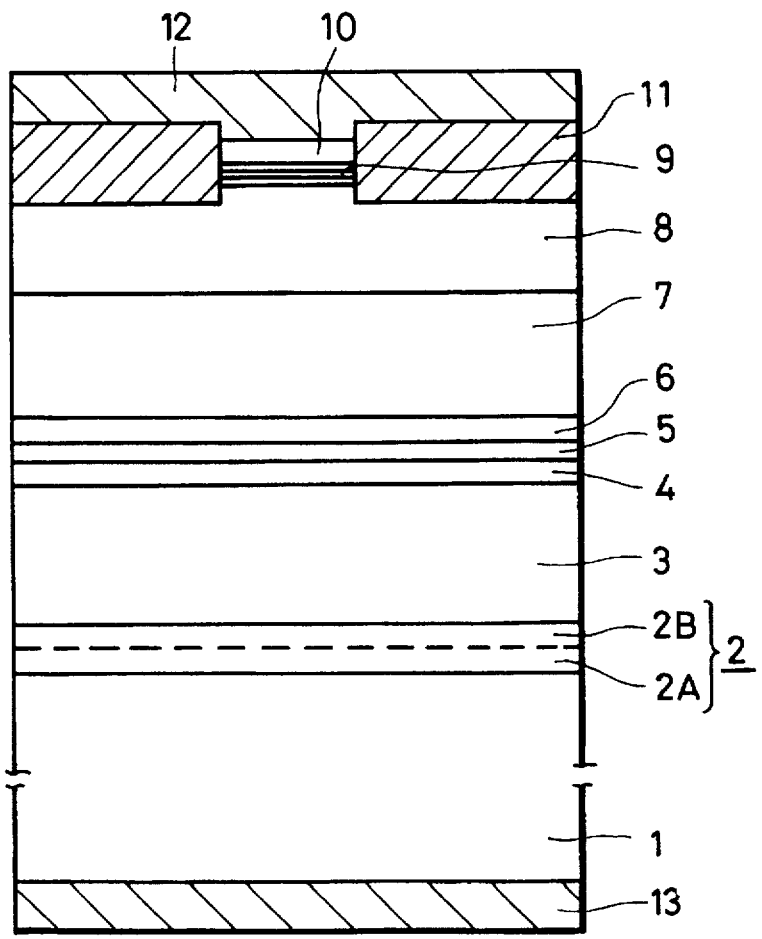
FIG. 2 is a schematic cross-sectional view of a semiconductor light-emitting device obtained by the manufacturing method of the present invention.

The method of the present invention can be applied to the case that a semiconductor light-emitting device, e.g., semiconductor laser with a structure shown in FIG. 2, for example, is manufactured.

As shown in FIG. 2, a n-type Cl-doped ZnSSe buffer layer 2, a Cl-doped ZnMgSSe first cladding layer 3, a cl-doped ZnSSe first guide layer 4, a ZnCdSe active layer 5, a p-type N-doped ZnSSe second guide layer 6, a N-doped ZnMgSSe second cladding layer 7, a N-doped ZnSSe capping layer 8, a quantum well structure portion 9 formed by repeatedly laminating N-doped ZnSe layers and N-doped ZnTe layers and a N-doped ZnTe contact layer 10 are continuously epitaxially grown on a n-type GaAs substrate 1 at a substrate temperature ranging from 250° C. to 300° C., e.g., 300° C. by MBE or MOCVD, in that order.

Then, a groove is formed across the contact layer 10 and the quantum well structure portion 9 at both sides of a central stripe portion and insulating layers 11 made of polyimide resin or $Al_2O_3$ is formed. Then, the insulating layers 11 are formed on the stripe-shaped contact layer 10 to make an ohmic-contact, thereby forming an electrode 12 to which Pd, Pt and Au are deposited sequentially. Another electrode 13 made of In is formed on the rear surface of the GaAs substrate to make an ohmic-contact.

The method of the present invention used when the semiconductor light-emitting device shown in FIG. 2 will be described more in detail below.

While the buffer layer 2 having a thickness ranging from 20 nm to 1.00 nm is epitaxially grown on the GaAs substrate 1, at least a lower buffer layer 2A of the buffer layer 2 and having a thickness of about 20 nm is epitaxially grown with a supplying ratio of S, Se and Zn ranging from 1.0 to 1.2 and then the remaining upper buffer layer 2B and the following respective semiconductor layers 3 to 10 are epitaxially grown with the VI/II ratio ranging from 1.3 to 2.5, e.g., 2.0. In particular, the first cladding layer 3, the first guide layer 4, the active layer 5, the second guide layer 6 and the second cladding layer 7 are epitaxially grown with a supplying ratio of VI-group element and II-group element supplied from molecular beam sources of respective elements to the substrate 1, i.e., VI/II ratio selected from 1.3 to 2.5, e.g., 2.0. Specifically, when the first cladding layer 3 and the second cladding layer 7 are grown epitaxially, a ratio between a total supplying amount of S, Se and a total supplying amount of Zn, Mg are selected to be 2.0. When the first guide layer 4 and the second guide layer 6 are grown epitaxially, a ratio between a total supplying amount of S, Se and a total supplying amount of Zn is selected to be 2.0. When the active layer 5 is epitaxially grown, a supplying ratio between the total supplying amount of S, Se and the total supplying amount of Cd is selected to be 2.0.

Figure 3:
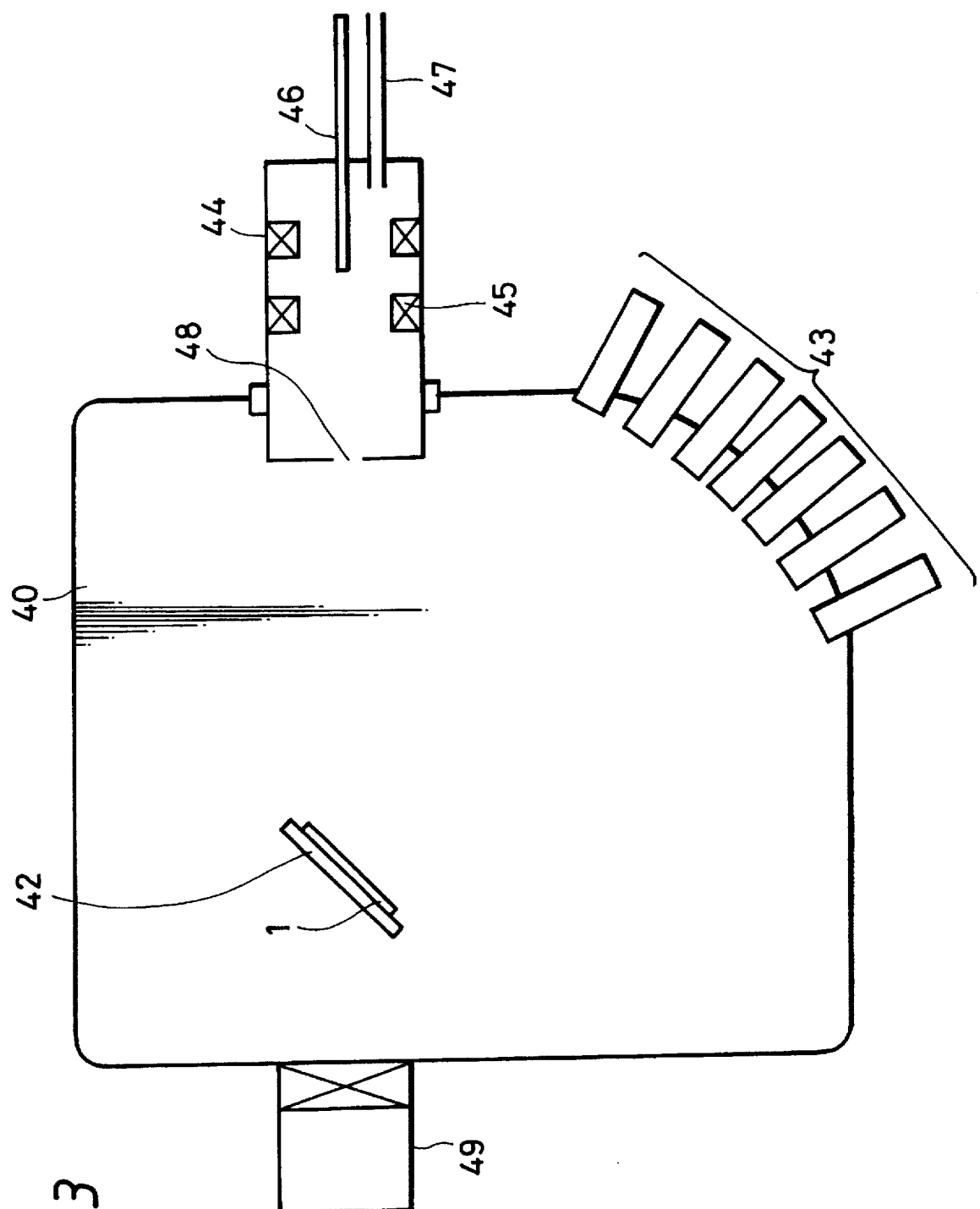
FIG. 3 is a schematic diagram showing an example of MBE apparatus for carrying out the manufacturing method of the present invention.

The respective compound semiconductor layers are epitaxially grown by MBE with an MBE apparatus schematically shown in FIG. 3.

As shown in FIG. 3, the MBE apparatus includes a vacuum chamber 40 having a super vacuum exhauster (not shown). A substrate holder 42 with the substrate 1 held thereon is disposed within the vacuum chamber 40.

The vacuum chamber 40 includes a plurality of molecular beam sources (K cells) which are opposed to the substrate 1 as material sources of II-VI compound semiconductor. The chamber 40 is provided with a plasma generating chamber 44 for irradiating plasma N (nitrogen) to the substrate 1. Magnets 45 are disposed within the plasma generating chamber 44. The plasma generating chamber 44 is provided with a microwave terminal 46 for supplying microwaves to the vacuum chamber 44 and a nitrogen gas conduit 47 for supplying a nitrogen gas into the vacuum chamber 40.

With the above-mentioned arrangement, the II-VI compound semiconductors are epitaxially grown on the substrate 1 with irradiation of molecular beams from the molecular beam sources 43 to the substrate 1. When a N-doped p-type II-VI semiconductor substrate is epitaxially grown on the substrate, a nitrogen gas is excited as a plasma nitrogen gas due to electron cyclotron resonance caused by application of magnetic field and microwaves in the plasma chamber 44. Then, the plasma nitrogen is introduced from a plasma inlet 48 of the plasma generating chamber 44 and irradiated on the substrate 1 together with the irradiation of molecular beams, whereby the N-doped compound semiconductor can be epitaxially grown on the substrate 1. In FIG. 3, reference numeral 49 depicts a substrate compartment, i.e., so-called reserve compartment by which the substrate 1 is delivered into and from the vacuum chamber 40.

The above respective semiconductor layers are epitaxially grown by this MBE apparatus. When the VI/II ratio is selected, if a temperature of a crucible for heating and evaporating raw materials of molecular beam sources of the molecular beam sources 43 is controlled, then the ratio with which II-group element and VI-group element are supplied to the substrate 1 within the chamber 40 can be controlled.

The epitaxial growth method of semiconductor according is not limited to the case that the II-VI compound semiconductor is epitaxially grown by MBE and can be applied to a case that the II-VI compound semiconductor is epitaxially grown by MOCVD.

A semiconductor light-emitting device made by the method according to the present invention, e.g., semiconductor laser demonstrated excellent flatness on each heterointerface across the active layers and could emit light stably over a long period of time.

While the method according to the present invention is applied to the semiconductor light-emitting device of so-called SCH (separate confinement heterostructure) structure in which the first and second cladding layers 3, 7 are formed across the active layer 5 through the first and second guide layers 4, 6, a fundamental principle of the present invention can be similarly applied to a semiconductor light-emitting device having a double-heterostructure without guide layers formed thereon and a variety of semiconductor devices.

According to the epitaxial growth method of semiconductor of the present invention, when the II-VI compound semiconductor is epitaxially grown, if the VI/II ratio in the crystal growth is controlled, i.e., the VI/II ratio is selected in a range of from 1.3 to 2.5, then a flatness of the topmost crystal surface and the heterointerface can be increased.

Therefore, a stress within the crystal can be reduced and the resulting semiconductor can be extended in life. Further, when a substrate temperature is selected in a range of from 250° C. to 300° C. wherein excellent crystallinity can be obtained in this epitaxial growth, an excellent flatness can be obtained. Thus, when the epitaxial growth method of semiconductor of the present invention is applied to the case that an excellent characteristic, e.g., semiconductor light-emitting device is obtained, it is possible to obtain a semiconductor light-emitting device with excellent light-emitting characteristics.

Furthermore, since the semiconductor light-emitting device which can emit light with a short wavelength over a long period of time can be fabricated by manufacturing a ZnMgSSe semiconductor light-emitting device according to the method of the present invention, a high-density optical recording or high-density reproducing light source can be realized.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. An epitaxial semiconductor growth method for growing at least two layers on a substrate, comprising the steps of:

epitaxially growing a first semiconductor layer with a first VI/II ratio; and epitaxially growing a second semiconductor layer with a second VI/II ratio, wherein said first VI/I ratio is different from said second VI/I ratio.

2. An epitaxial growth method of semiconductor according to claim 1, wherein a substrate temperature at which said II-VI-group semiconductor is epitaxially grown is selected in a range of from 250° C. to 300° C.

3. An epitaxial growth method of semiconductor according to claim 1, wherein said first and second semiconductor layers each comprise compound semiconductors of three elements or greater.

4. An epitaxial growth method of semiconductor according to claim 1, wherein in the second semiconductor layer the II-group elements are Zn and Mg and the VI-group elements are S and Se.

5. An epitaxial growth method of semiconductor according to claim 1, wherein in said first semiconductor layer the II-group element is Zn and the VI-group elements are S and Se.

6. An epitaxial growth method of semiconductor according to claim 1, wherein in said second semiconductor layer the II-group elements are Zn and Cd and the VI-group element is Se.

7. An epitaxial semiconductor growth method comprising the steps of:

epitaxially growing a buffer layer on a substrate such that the VI/II ratio of molecular beams falls in a range of from about 1.0 to about 1.2; and epitaxially growing at least one cladding layer on said buffer layer such that the VI/II ratio of molecular beams falls in a range of from about 1.3 to about 2.5.

8. An epitaxial semiconductor growth method according to claim 7, wherein said buffer layer is a ZnSSe layer, and said cladding layer is a ZnMgSSe layer.

* * * * *